US006425018B1

(12) United States Patent
Kaganas et al.

(10) Patent No.: US 6,425,018 B1
(45) Date of Patent: Jul. 23, 2002

(54) PORTABLE MUSIC PLAYER

(76) Inventors: Israel Kaganas; Luis Cavada, both of 308 S. Dixie Hwy., Hallandale, FL (US) 33009

( * ) Notice: Subject to any disclaimer, the term of this patent is extended or adjusted under 35 U.S.C. 154(b) by 0 days.

(21) Appl. No.: 09/232,399

(22) Filed: Jan. 15, 1999

Related U.S. Application Data

(60) Provisional application No. 60/076,372, filed on Feb. 27, 1998, provisional application No. 60/082,144, filed on Apr. 17, 1998, provisional application No. 60/086,070, filed on May 20, 1998, and provisional application No. 60/088,251, filed on Jun. 5, 1998.

(51) Int. Cl.$^7$ .................................................. G06F 3/00
(52) U.S. Cl. ............................. 710/1; 710/20; 710/64; 710/100
(58) Field of Search ............................. 710/1, 10, 20, 710/72, 73, 108, 109, 5, 7, 15, 52, 57, 61, 62, 63, 64, 100

(56) References Cited

U.S. PATENT DOCUMENTS

| 4,614,144 A | | 9/1986 | Sagara et al. |
| 4,667,088 A | | 5/1987 | Kramer et al. |
| 4,813,014 A | | 3/1989 | DeBell |
| 4,905,289 A | | 2/1990 | Micic et al. |
| 5,367,646 A | * | 11/1994 | Pardillos et al. ............ 395/325 |
| 5,482,352 A | | 1/1996 | Leal et al. |
| 5,486,645 A | | 1/1996 | Suh et al. |
| 5,510,573 A | | 4/1996 | Cho et al. |
| 5,535,356 A | | 7/1996 | Kim et al. |
| D372,707 S | | 8/1996 | Grewe et al. |
| D374,236 S | | 10/1996 | Grewe et al. |
| 5,576,985 A | | 11/1996 | Holtz |
| 5,606,143 A | | 2/1997 | Young |
| 5,610,822 A | | 3/1997 | Murphy |
| 5,616,876 A | * | 4/1997 | Cluts ........................... 84/609 |
| 5,624,156 A | | 4/1997 | Leal et al. |
| 5,625,350 A | | 4/1997 | Fukatsu et al. |
| 5,625,608 A | | 4/1997 | Grewe et al. |
| 5,635,925 A | | 6/1997 | Kishi et al. |
| 5,638,321 A | | 6/1997 | Lee et al. |
| 5,638,426 A | | 6/1997 | Lewis |
| 5,657,074 A | | 8/1997 | Ishibe et al. |
| 5,670,730 A | * | 9/1997 | Grewe et al. ................ 84/609 |
| 5,671,319 A | | 9/1997 | Ueda |
| 5,691,964 A | | 11/1997 | Niederlein et al. |
| 5,694,516 A | | 12/1997 | Grewe et al. |
| 5,696,928 A | | 12/1997 | Grewe et al. |
| 5,724,482 A | | 3/1998 | Grewe et al. |
| 5,731,852 A | | 3/1998 | Lee |
| 5,734,119 A | | 3/1998 | France et al. |
| 5,748,756 A | | 5/1998 | Leal et al. |
| 5,751,504 A | | 5/1998 | Tanaka |
| 5,754,979 A | | 5/1998 | Lee et al. |
| 5,758,321 A | | 5/1998 | Lee |
| 5,764,560 A | | 6/1998 | Lee et al. |

(List continued on next page.)

OTHER PUBLICATIONS

Title: The 4– Ounce Victrola, Author: Stephen Manes, Date: Dec. 28, 1998, pp: 2, Published by Forbes, Country: U.S.

(List continued on next page.)

Primary Examiner—Jeffrey Gaffin
Assistant Examiner—Rijue Mai
(74) Attorney, Agent, or Firm—Robert M. Schwartz

(57) ABSTRACT

A portable music player computational device having a digital signal processor, for processing information, and a microcontroller connected to the digital signal processor by an electronic bus, one or more semiconductor memory devices connected to the digital signal processor by a second electronic bus, where the microcontroller controls the transfer of electronic information to and from one of said memory devices, one or more input sources connected to said microcontroller, said input sources providing information for the operation of said music player, one or more output devices connected to said digital signal processor where said microcontroller controls the transfer of electronic information to one or more of said output devices.

16 Claims, 3 Drawing Sheets

U.S. PATENT DOCUMENTS

| | | | |
|---|---|---|---|
| 5,767,430 A | | 6/1998 | Yamanoue et al. |
| 5,787,399 A | | 7/1998 | Lee et al. |
| 5,798,921 A | * | 8/1998 | Johnson et al. ............... 700/94 |
| 5,867,580 A | * | 2/1999 | Anderson et al. ............. 381/61 |
| 5,986,200 A | * | 11/1999 | Curtin ......................... 84/609 |
| 6,151,235 A | * | 11/2000 | Kitagawa et al. ............. 365/45 |

OTHER PUBLICATIONS

Title: With A Click A New Era of Music Dawns, Author: Jon Pareles Date: Nov. 15, 1998, pp: 3, Published by: The New York Times Arts and Leisure, Section 2, Country: U.S.

Title: US Report: MP3 Player Author: Michael Mullen, Date: Oct. 23, 1998, pp: 1, Published by: GameSpot, UK, Country: United Kingdom.

Title: MP3 Player To Be Sold In USA Market, Author: Unknown Date: Oct. 30, 1998, pp: 1, Published by: Korea Times, Country: Korea.

Title: Samsung Advances Into MP3 Player Market, Author: Unknown Date: Oct. 20, 1998, pp: 1, Published by: Korea Times Country : Korea.

Title: Start–up Counts on Changing Tune of Music Business Author: Jason Chervokas, Date: Jul. 13, 1998, pp: 3, Published by: The Industry Standard, Country: U.S.

Title: Samsung Announces Portable Player, Author: Michael Robertson, Date: Unknown, pp: 1, Published by: MP3.COM, Country: U.S.

Title: Diamond Multimedia Prevails at Hearing for a Preliminary Injunction Requested by The Recording Industry Association of America, Author: Unknown, Date: Nov. 5, 1998, pp: 3,–U.S.

Title: Diamond Multimedia to Temporarily Delay Shipment of The RIO PMP300 Portable Music Player, Author: Unknown, Date: Nov. 5, 1998, pp: 2, Published by: Unknown, Country: U.S.

Title: Diamond Multimedia to Fight Legal Action Filed by The Recording Industry Association of America (RIAA), Author: Unknown Date: Nov. 5, 1998, pp: 3, Country: U.S.

* cited by examiner

PORTABLE MUSIC PLAYER

CROSS-REFERENCES TO RELATED APPLICATIONS

This application claims the benefit of U.S. Provisional Applications No. 60/076,372 filed Feb. 27, 1998; No. 60/082,144 filed Apr. 17, 1998; No. 60/086,070 filed May 20, 1998; and No. 60/088,251 filed Jun. 5, 1998. These provisional applications are incorporated herein by reference.

BACKGROUND OF THE INVENTION

1. Field of the Invention

This invention relates to a portable music player device adapted to play and record audio and video material and further adapted to receive and communicate with other sources. The player includes a computational device and high density electronic ROM or RAM memory in a removable card.

2. State of the Prior Art

In the prior art, it is known to use high density ROM memory cards in a computational device that has a single use or function. These cards are also known as MMC cards and have ROM or RAM memory. For example, it is known to use of an MMC card in a portable telephone that stores addresses and telephone numbers. It is also known, for example, to use an MMC card inserted into an automobile navigational system or other portable navigational system that stores maps and other information for the navigational system to reference. However, these devices, as presently used, are single-function devices, e.g., the address telephone information MMC card cannot be placed in the map device, nor can the map device be placed into the telephone device, since these machines are single-function machines. Generally in the prior art, uses of MMC cards are limited to where the operating system is located in the host, and the data is located on the portable MMC card. In the present device, the operating system resides in the MMC card.

BRIEF DESCRIPTION OF THE DRAWINGS

In the accompanying drawings where like reference numbers are applied to like structural elements.

DETAILED DESCRIPTION OF THE PREFERRED EMBODIMENT

The drawings depict an illustrative embodiment of this invention. Inventors incorporate herein by reference the disclosures of each of the above captioned provisional applications as if set forth in full herein.

Figure 1:
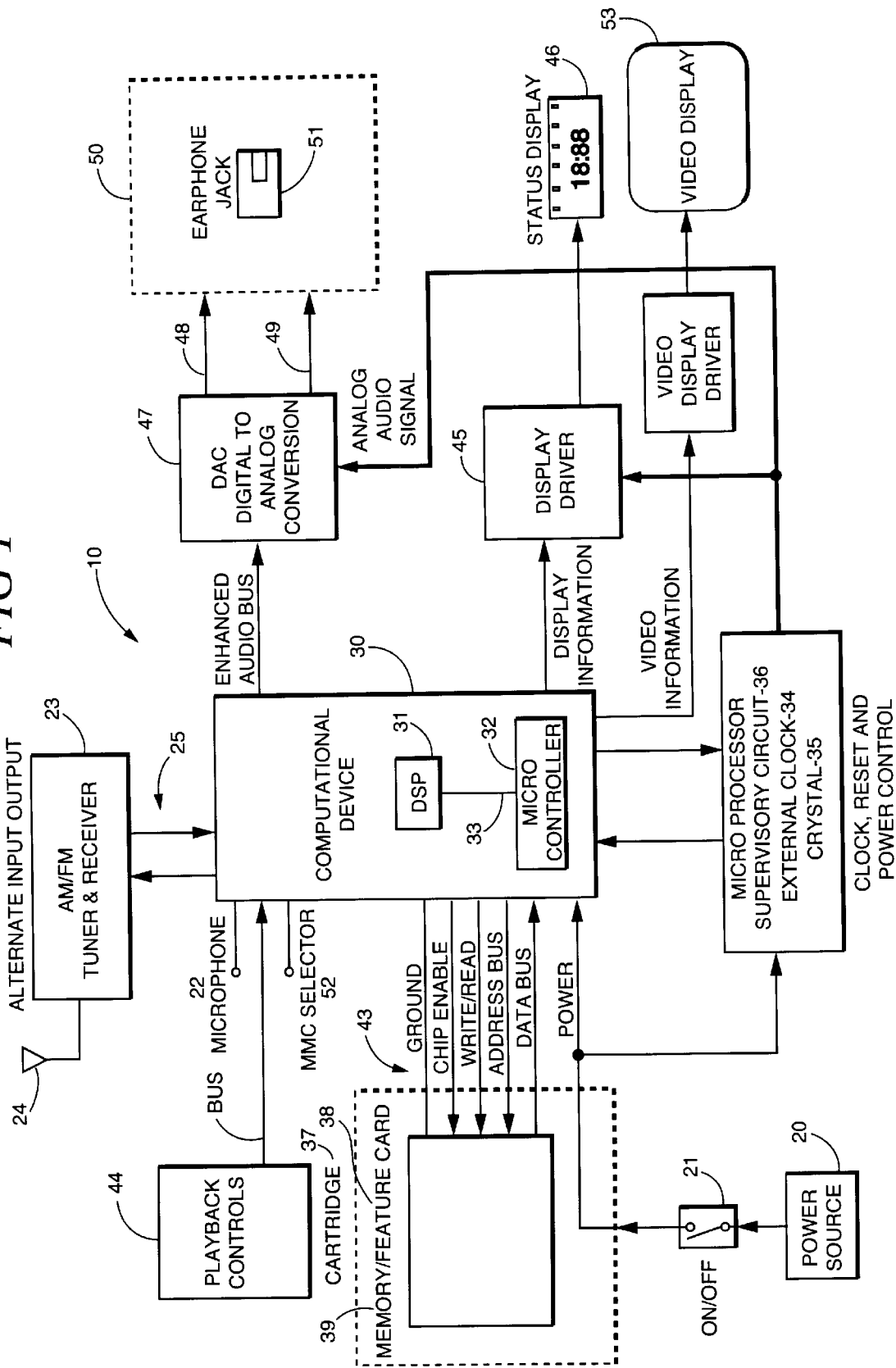
FIG. 1 is a schematic diagram of the portable playing device shown in block form.
Figure 2:
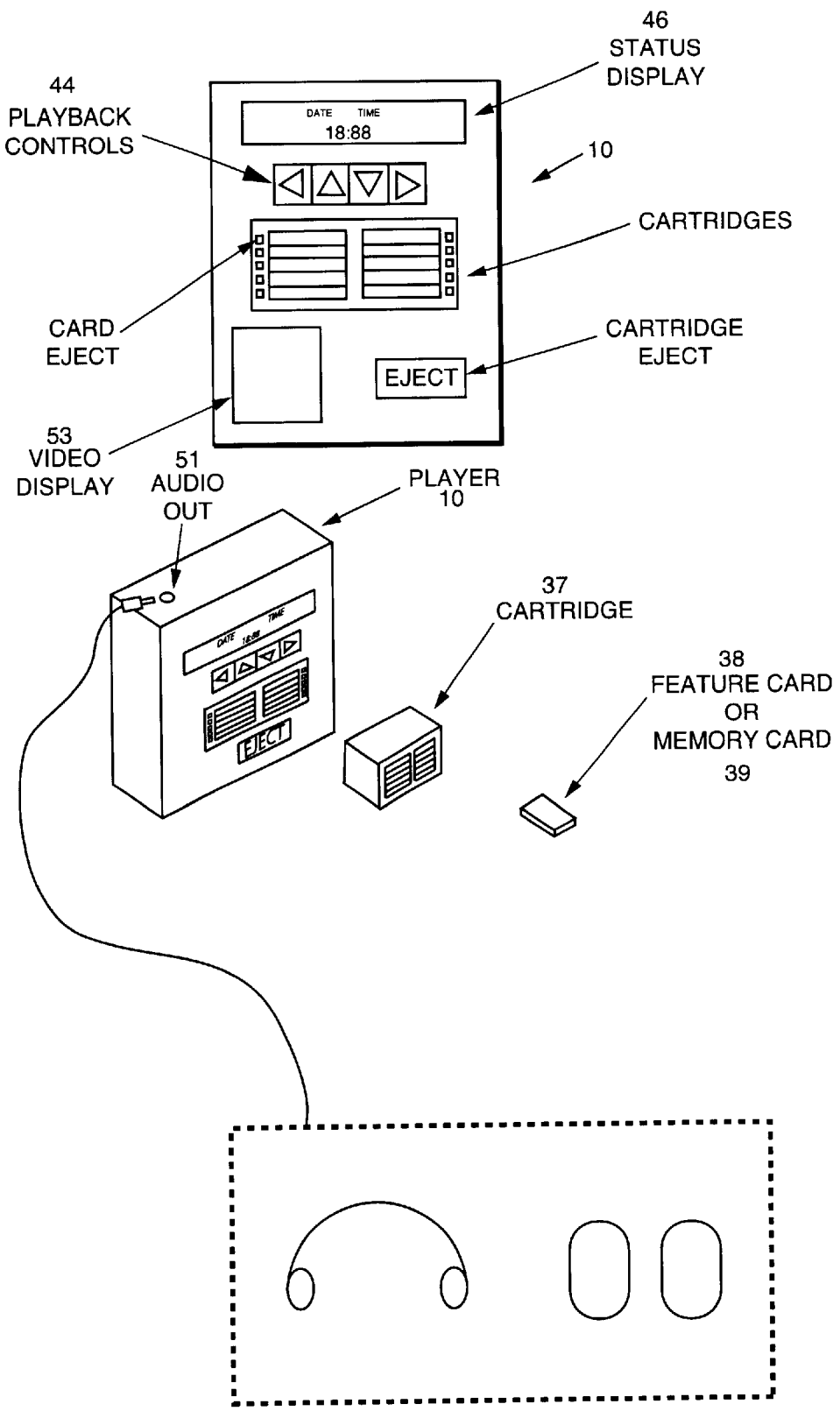
FIG. 2 is a front view of the front panel of the portable playing device shown in block diagram portions including the portable playing device, its cartridge, feature card and memory card, as well as headphones.

FIG. 1 is a block schematic diagram of the portable player (10). Portable player (10) would include a power source (20) such as batteries or rechargeable batteries, internal or external, which is connected to player (10) by on/off switch (21). Portable player (10) includes a computational device (30) to process data. The computational device includes a digital signal processor (31), also known as a DSP. The DSP (31) is a super-fast microprocessor which performs many tasks at the same time. In the preferred embodiment, the DSP is manufactured by Analog Devices, Inc., Part No. ADSP2185L, Norwood, Mass. This DSP operates at approximately 45 MIPS (million instructions per second).

In addition to DSP (31), computational device (30) includes a microcontroller (32), which is a semiconductor chip manufactured by Hitachi Semiconductor of Japan, Model No. HD6433334YF, operating at 49 MHz (Megahertz). DSP (31) and microcontroller (32) are connected along a bus (33). Microcontroller (32) is programmed to manage and handle playback controls and information flow. This flow or transfer of information, or data, occurs between a memory/feature card (39/38) and DSP (31). In addition, microcontroller (32) manages the output display of information to an external status display (46), which displays information about the status of portable player (10). In addition to the status display (46), the micro controller will also output information to external video display (53).

Computational device (30) is controlled by an external clock (34), which includes a crystal means (35) (the crystal sets or delivers a standard pulse at 24.5 MHz) and a microprocessor supervisory circuit (36). This supervisory circuit (36) controls a reset means for microcontroller (32) and DSP (31) by monitoring the power source and the on/off switch. The microprocessor supervisory circuit (36) issues a signal to microcontroller (32) and DSP (31) at power start-up, when the proper voltage (e.g., 3 volts) is reached. At this condition, a reset signal is sent from the micro supervisory circuit (36) to the microcontroller (32) and the DSP (31) to reset and start their respective functions simultaneously from program step zero. The supervisory circuit (36) also functions during a power interruption or power failure or other decrease of power to the system to reset the DSP (31) and microcontroller (32) as just described.

Also connected to computational device (30) is an optional cartridge (37), which may contain one or more feature cards (38) or memory cards (39). The latter, memory card (39), is a small card containing electronic semiconductor memory, either RAM or ROM. As to ROM (Read Only Memory), the memory card (39) would contain previously recorded data (or information). As to RAM (Random Access Memory) the electronic semiconductor memory has the ability to not only contain prerecorded information, but also to record information in random locations. An example of a memory card is the Siemens MMC Multimedia Card (MMC card), Germany, and other similar cards containing electronic memory devices. These MMC cards are provided in a plastic molding case that have external input and output terminals. Memory cards can also be used for the distribution of recorded information including in the music industry albums or collections of songs on ROM or combinations of ROM and RAM for interactive instructions, books or instructional information on any subject matter that would be purchased from or provided by someone.

Figure 3:
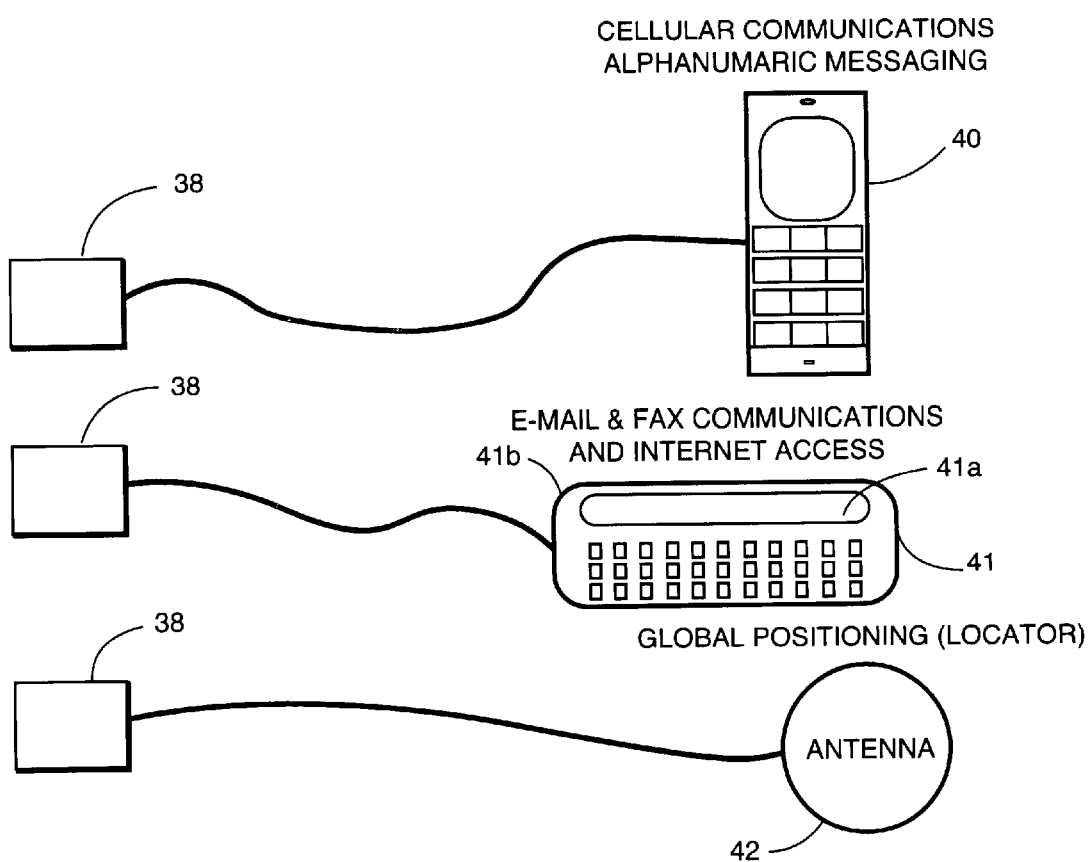
FIG. 3 is a view of some intended uses of feature cards.

In use, a memory card (39) is inserted into either cartridge (37) or directly into other receiving means of portable player (10). Feature card (38) is physically and mechanically the same as memory card (39), so they can plug into the same place or location. The feature card (38) and memory card (39) both contain proprietary firmware, hardware, and software to enable features and/or functions of portable player (10). To provide these features (see FIG. 3), feature card (38) can connect external means (e.g., direct connect or wireless, such as infrared or RF—radio frequency communication system) to a cellular communications and/or an alphanumeric messaging terminal device (40); or to an e-mail or fax device; to an Internet (worldwide communications network)

access device (41); or to a global positioning device (42). For these features, for example, a portable telephone (40) is linked to the feature card (38)—the link can be either a cable or infrared or RF (radio frequency) connections. The feature card is preprogrammed with instructions for the portable telephone. The data is then downloaded into computational device (30). This preprogrammed information, loaded into the computational device may include an operating system and other software, so that portable player (10), now programmed by feature card (38) operates as dictated by the operating system of the feature card (38). The computational device (30) is now linked to telephone unit (40). Information can be received and transmitted via telephone or other transmission methods. The feature card thus includes an operating system, and it can also include data, such as telephone names, numbers, addresses, etc. Thus, a feature card (38) contains prerecorded information used by computational device (30), to become, as a chameleon, the attributes and functions of the desired device, e.g., a portable telephone. Therefore, feature card (38) for a telephone device would include the software to be loaded into DSP (31) to function as a portable telephone and further include data such as telephone numbers.

Likewise, a terminal as shown (41) a keyboard with a display (41a) is linked as heretofore described to a feature card (38) that is connected to cartridge (37) and for whatever information the keyboard is to be used, e.g., e-mail, fax communications, or accessing the Internet. The operating system loaded from the feature card can be, e.g., Windows 95 ® or a subset thereof or Windows CE® (trademarks of Microsoft Corporation, Bellevue, Wash.), or any other operating system, so that one can communicate using the computational device to access the Internet and a means to communicate over the Internet. Connections to the worldwide information network could be made either by using a phone jack (41b) where a line would be connected directly to, for example, a wall socket containing telephone or cable access, etc., or to a portable wireless telephone device. It is also conceivable that two feature cards could be active, so that the communications would go through, for example, portable telephone (40). As another alternative, the operating system on the feature card (38) for keyboard (41) could contain as a subset the operating system to operate phone (40). At the same time communication is necessary, the operating system would analyze where the communication is to take place. First it will check the jack (41b), would there be no connection, it will then check for another feature card indicating the presence of wireless telephone (40). In either case, once the communication device is selected, the appropriate command set is issued to transmit information.

In use the operating system for keyboard (41) transmits data, whether the data is stored in the keyboard or stored in the computational device (30) memory, or at or with a selected memory card that contains, for example, a portable telephone (40). Access to these cards is through serial bus (43) and a feature card (38).

In use, portable telephone (40) would be turned on, then keyboard (41) is turned on, as soon as keyboard (41) is turned on, its operating system on card (38) is downloaded or transferred into computational device (30). It will then check to find the feature card (38) for telephone (40). If it doesn't exist or it's off, a message will be sent to the user through display (41a), the message presumably would read that communications will have to take place through jack (41b). If device (40) is on, then communications will take place through device (40). As described above, each time the transmission of data is required, the active communication device is detected. In order to ensure proper operation, the entire operating system for portable telephone (40) will be included as a subset of operating system found on feature card (38) of keyboard (41).

The Global Positioning device (42) (locator), acts as an antenna to receive signals from satellites that transmit global positioning information. At present such a system is called GPS, but in the future may involve other positioning schemes/systems. A feature card (38) will have map information in its memory in addition to the operating system to operate computational device (30) as a GPS device. In use, the display of portable player (10), video display (53), would display the map information visually for the user.

Likewise an input source could be from a broadcasting of information received by direct connect, e.g., cable television connections or by non-direct connections, e.g., an external antenna or infrared or RF receiver. When the broadcast source is received the micro controller will select the input information pursuant to the instructions contained in the memory device.

The player also includes an AM/FM tuner and receiver (23) with an antenna (24) connected by a bus (25) to computational device (30), used for an alternate input source and output device.

Feature card (38) incorporates external instructions that control portable player (10) to perform any function within its capability as dictated by the feature card. Cartridge (37) interfaces with computational device (30) through an interface (43). This interface (43) is a serial interface, a bus which allows the connection between the cartridge and the computational device (30). Interface (43) can be divided into multiple interfaces (busses). Each bus can directly interface with up to 65,536 ($2^{16}$) memory or feature cards. Interface bus (43) is designed to take advantage of the technology of the MMC card by providing seven connections and, thus, a seven-line bus. The typical serial bus may contain a minimum of three lines. However, in this preferred embodiment, seven lines are used to take advantage of the capabilities of the device. The arrangement of the interface bus (43) connected to cartridge (37) is such that each memory or feature card inserted into cartridge (37) is directly connected to interface bus (43), such that every memory/feature card can communicate by an addressing means with computational device (30), or computational device (30) can communicate with any memory/feature card by direct addressing techniques. In the preferred embodiment, lines 1–7 are as follows:

1. No connection
2. Command line (chip-enable)
3. Ground
4. Power
5. Clock
6. Ground
7. Data The MMC cards are designed such that and an interface bus (43) takes advantage that whether the MMC card is either a feature card (38) or a memory card (39), all have the same connections to interface bus (43). Each MMC card (feature card or memory card) has its own unique identifier (ID), built in and assigned by the manufacturer.

In the prior art, IC memory cards are typically in a RAM format connected by a serial bus, or in ROM format connected with a parallel bus. This difference in bus architecture makes it difficult to design a system which can handle both types simultaneously. To do so would include two sets of connection schemes, and two I/O interface systems. Thus, in the prior art, in use, interface bus (43) provides the ability of connecting thousands of feature cards or memory cards to the computational device (30) where each said card (38) or (39) can be accessed individually.

Attached to the computational device is playback controls (44). Playback controls are any means to influence the operation or control of the computational device or the portable player (10). Typically, such buttons might contain Forward, Back, Play, Record, Pause, On, Off, Bass, Treble, and the like. However, it is anticipated that said playback controls may not only be mechanical type buttons but other means of interactive communications with the portable player (10) such as audio input controls, voice recognition systems, microphones, light sensitive means, infrared, wireless, or RF signals, as is presently known. The microphone (22) is provided as an input source as well. The playback controls (44) are connected to computational device (30) by a bus means. Any intelligence of the playback controls would be obtained by either the computational device and/or the cartridge. In the present device, the bus between the playback control (44) and the computational device (30) is 12 lines.

Also attached to computational device (30) is a display driver (45). Display driver (45) is connected to computational device (30) by a serial bus. The display driver outputs to a status display (46) by a matrix or parallel bus in order to display the appropriate pixels. The display driver is manufactured by Seiko/Epson of Japan, Part No. SED1520. Status display (46) is manufactured by Truly, Model No. MSC-G12232DYSY-3N, located in Hong Kong, China.

Also attached to computational device (30) is a digital to analog converter (DAC) 47. The dual DAC (47) is manufactured by Analog Devices, Part No. AD73322. This is a dual DAC because there are two inputs and two outputs, right output (48) and left output (49) as typically used in a stereo device. Output (50) is typically an earphone jack (51), or external speaker with amplification (not shown). An amplifier (not shown) can be included in the circuit output block (50) in order to drive external speakers.

It is intended that the operating system for portable player (10) be located in cartridge (30) on either the feature card (38) or memory card (39). However, as is typical with any electronic computational device, portable player (10) must initialize itself at startup. The initialization instructions are located in computational device (30) in either DSP (31) or in microcontroller (32). Once initialized, portable player (10) operates similar to a processor using a disk operating system, where the operating system software is transferred to the processor or connected to the processor. In the present case as heretofore stated, an operating system resides on the memory card or feature card. The initialization procedure will query all the connected memory/feature cards to obtain the most up to date operating system. Specifically, if several feature cards or memory cards are installed in the cartridge, they will be inspected to determine which feature card or cards has the most up to date or most recent version of the operating system. Existing operating systems and subsequent operating systems will be backwards compatible. As new operating systems are developed, they will be incorporated into the newer products, while maintaining the compatibility with earlier operating systems and products. As with all operating systems, the operating system is loaded into the computational device as needed. Each memory card or feature card will contain program data and informational data for the operating system to process.

The operating system will include algorithms for compressing and decompressing data. These algorithms will be contained on the memory and feature cards. There are numerous algorithms for compressing and decompressing data. Some of these algorithms are non proprietary and are supervised and monitored by an international standard committee. There are also proprietary routines for data compression/decompression which can also be used to perform the tasks desired. Each card can thus contain its own algorithms based on the type of information/feature on the card. Thus, as long as the algorithim is compatible with the computational device (30), any such operational system can be used.

In use, a typical memory card/feature card would already have data that is desired to be used by the user, whether it be music or information. This data is stored on the card in a compressed format from the manufacturer or the manufacturer's customer. Also, included on the card is the operating system and the algorithms to compress or decompress the data so that the card can communicate data to the computational device. In the event there are multiple cards plugged into the cartridge and the user desires to switch from one card to a subsequent card, or from that subsequent card to a previous card, when the switch is made the computational device inquires into the version of the algorithms used for the compression/decompression of data information on that particular selected card. If the algorithms are the same as presently loaded into the computational device, the portable player continues operating. However, if the algorithms are different, then the most recent algorithm is transferred from the selected card into the computational device and play resumes with no interruption to the user or at least no perceived interruption to the user. Presumably, the operating system in the computational device will be the same operating system or it will be compatible with that of the selected card.

Regarding the operating system selection technique in the computational device, the operating system will decide whether to upload the operating system of a non-selected card inserted after play begins at the time the new card with the most recent operating system is loaded or inserted into the cartridge or it will wait to determine whether to upload a higher level operating system from a selected card when that card is accessed.

For purposes of explanation, the inventors have disclosed only the playback mode of the product. Introduction of an Analog to Digital converter would allow the recording of information either audio or voice to the MMC card.

Since the compression/decompression algorithms are stored in each memory card, a user can always benefit from new technology advances in algorithms. As new more powerful algorithms are invented they can be used since they will be provided in the memory card and it is thus not machine dependent.

In the present system, since algorithms and in fact the operating system is stored on the memory/feature card, each song can have its own sampling rate information. Thus, simple songs or narratives can be of low sampling rates, while more complex songs can have higher sampling rates. This way, the lower complexity programs can occupy less memory within a memory card and thus would have a higher density. Sample rate is how often the analog signal is sampled and converted to digital information. This is a well known technique in the art. At this time, and for future design versions, the MMC cards an all other active devices will incorporate the latest advancements in power management to achieve long operational times from the portable battery sources that it uses.

In use, when the computational device and the player are performing their normal function and it is desirous to change functions, e.g., switching from one feature card to a second feature card, the following occurs: Upon activation of the MMC selector (52), the computational device—which can be addressable or operate in sequential mode, by voice or electromechanical means—selects the next memory/feature card that is desired by the user. Upon the next MMC card being selection, the computational device loads information from the selected card into its memory as described above, and the process begins again. The computational device now assumes the attributes of the selected memory/feature card.

What is claimed is:

1. A portable music player computational device comprising:

a digital signal processor, for processing information, a microcontroller connected to said digital signal processor by an electronic bus, one or more semiconductor memory devices connected to said digital signal processor by a second electronic bus, said microcontroller controlling the transfer of electronic information to and from one of said memory devices, wherein a said memory device includes an external connection for connecting said memory device, while said memory device is connected to said second electronic bus, to a personal communication device, where said memory device contains information to operate said personal communication device, such that said music player operates as instructed by information contained in said memory device, one or more input sources connected to said microcontroller, said input sources providing information for the operation of said music player, one or more output devices connected to said digital signal processor where said microcontroller controls the transfer of electronic information to one or more of said output devices.

2. A portable music player computational device as in claim 1, further comprising:

an interface cartridge connected to said second electronic bus, containing a plurality of addressable connections for receiving said memory devices, each said memory device addressable for transfer of information to and from said digital signal processor.

3. A portable music player computational device as in claim 1, wherein said memory devices are removable high density electronic semiconductor memory supported in a small plastic molded card, said memory devices capable of storing information, said plastic molded card having external electronic terminals for said respective said memory device, said terminals providing a connection between said memory device and said second electronic bus.

4. A portable music player computational device as in claim 1, wherein said personal communication device is a cellular telephone communications device connected to said external connection of said memory device by a wireless communication connection between said memory device and said cellular telephone communications device, said memory device connected with said cellular telephone communications device having prerecorded information including an operating system, firmware and other instructional and data information such the operation of that said personal communications device functions will be performed by said music player.

5. A portable music player computational device as in claim 1, wherein said personal communication device is a global positioning device, said memory device connected with said global positioning device having prerecorded information including an operating system, firmware an other instructional and data information such that the operating functions of said global positioning device will be performed by said music player.

6. A portable music player computational device as in claim 3, wherein a selected said memory device contains information to operate said music player including a software operating system for controlling said music player, wherein said operating system is loaded from said memory device into said music player by firmware located in said music player during start up initialization routines performed by said music player.

7. A portable music player computational device as in claim 6, wherein said initialization routines query each said connected memory device to determine which said memory device contains the most up to date operating system to be used by said music player, and loading a said selected operating system into said music player.

8. A portable music player computational device as in claim 7, wherein said music player performs the functions of a said selected memory device whether or not the most up to date operating system is loaded from said selected memory device.

9. A portable music player computational device as in claim 6, wherein a said operating system contains information to choose variable sampling rates to optimize memory, optimize time constraints and vary output and input quality pursuant to information contained within a said selected memory device.

10. A portable music player computational device as in claim 3, wherein said second electronic bus is a serial bus, such that each and every said memory device has a unique address on said second electronic bus.

11. A portable music player computational device as in claim 10, wherein said memory devices contain information in random access memory or read only memory and one or more said memory devices may contain information in random access memory and one or more in read only memory.

12. A portable music player computational device as in claim 11, wherein said information is prerecorded in read only memory.

13. A portable music player computational device as in claim 11, wherein said memory device receives information from said music player that is recorded on said memory device in random access memory.

14. A portable music player computational device as in claim 1, wherein said personal communication device is a cellular telephone communications device connected to said external connection of said memory device by a direct connect communication connection between said memory device and said cellular telephone communications device, said memory device connected with said cellular telephone communications device having prerecorded information including an operating system, firmware and other instructional and data information such the operation of that said personal communications device functions will be performed by said music player.

15. A portable music player computational device as in claim 3, wherein a personal communication device connects to said memory device by said second electronic bus, where said memory device contains information to operate said personal communication device, such that said music player operates as instructed by information contained in said memory device.

16. A portable music player computational device as in claim 1, wherein said input source is from a broadcast source of a plurality of information sources whereby said microcontroller receives said input source of information to perform a function as specified by said memory device.

* * * * *